(12) United States Patent
Hu

(10) Patent No.: US 11,211,348 B2
(45) Date of Patent: Dec. 28, 2021

(54) FIRST WAFER, FABRICATING METHOD THEREOF AND WAFER STACK

(71) Applicant: WUHAN XINXIN SEMICONDUCTOR MANUFACTURING CO., LTD., Hubei (CN)

(72) Inventor: Xing Hu, Hubei (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 5 days.

(21) Appl. No.: 16/626,785

(22) PCT Filed: Nov. 19, 2019

(86) PCT No.: PCT/CN2019/119524
§ 371 (c)(1),
(2) Date: Dec. 26, 2019

(87) PCT Pub. No.: WO2021/031419
PCT Pub. Date: Feb. 25, 2021

(65) Prior Publication Data
US 2021/0057359 A1   Feb. 25, 2021

(30) Foreign Application Priority Data
Aug. 22, 2019   (CN) .................. 201910780406.9

(51) Int. Cl.
*H01L 23/00* (2006.01)
*H01L 25/11* (2006.01)
(Continued)

(52) U.S. Cl.
CPC ........ *H01L 24/05* (2013.01); *H01L 21/76805* (2013.01); *H01L 21/76877* (2013.01);
(Continued)

(58) Field of Classification Search
CPC ......... H01L 24/03; H01L 24/05; H01L 24/08; H01L 23/535; H01L 21/76805;
(Continued)

(56) References Cited

U.S. PATENT DOCUMENTS

2009/0160051 A1 * 6/2009 Lee .................. H01L 24/05
257/737
2016/0247747 A1   8/2016 Janzen et al.
(Continued)

FOREIGN PATENT DOCUMENTS

CN         103378109 A    10/2013
CN         107994043 A     5/2018
(Continued)

*Primary Examiner* — Sonya McCall-Shepard
(74) *Attorney, Agent, or Firm* — Muncy, Geissler, Olds and Lowe, P.C.

(57) ABSTRACT

A first wafer, a method of fabricating thereof and a wafer stack are disclosed. The first wafer includes a first substrate, a first dielectric layer on the first substrate, first metal layers embedded in the first dielectric layer, first switching holes extending partially through the first dielectric layer and exposing the first metal layers, a first interconnection layer filling up the first switching holes and electrically connected to the first metal layers, a first insulating layer residing on surfaces of both the first dielectric layer and the first interconnection layer, first contact holes extending through the first insulating layer and exposing the first interconnection layer, and a second interconnection layer filling up the first contact holes and electrically connected to the first interconnection layer. Filling the first contact holes and the first switching holes with different interconnection layers reduces the difficulty in fabricating interconnection structures for the first metal layers.

7 Claims, 4 Drawing Sheets

(51) Int. Cl.
  *H01L 25/065* (2006.01)
  *H01L 23/532* (2006.01)
  *H01L 23/535* (2006.01)
  *H01L 23/522* (2006.01)
  *H01L 23/48* (2006.01)
  *H01L 21/768* (2006.01)

(52) U.S. Cl.
  CPC ...... *H01L 21/76895* (2013.01); *H01L 23/535* (2013.01); *H01L 23/53257* (2013.01); *H01L 24/03* (2013.01); *H01L 24/08* (2013.01); *H01L 25/0657* (2013.01); *H01L 25/117* (2013.01); *H01L 2224/03462* (2013.01); *H01L 2224/03616* (2013.01); *H01L 2224/05025* (2013.01); *H01L 2224/05147* (2013.01); *H01L 2224/08145* (2013.01)

(58) Field of Classification Search
  CPC ......... H01L 21/76895; H01L 21/76877; H01L 2224/05025; H01L 2224/08145; H01L 25/0657

See application file for complete search history.

(56) References Cited

U.S. PATENT DOCUMENTS

2017/0207158 A1* 7/2017 Kang ............... H01L 24/09
2019/0139820 A1* 5/2019 Yang ............ H01L 23/53238
2019/0148336 A1* 5/2019 Chen ............... H01L 24/24
  257/774

FOREIGN PATENT DOCUMENTS

| CN | 109148415 A | 1/2019 |
| CN | 109166840 A | 1/2019 |
| CN | 109411443 A | 3/2019 |

* cited by examiner

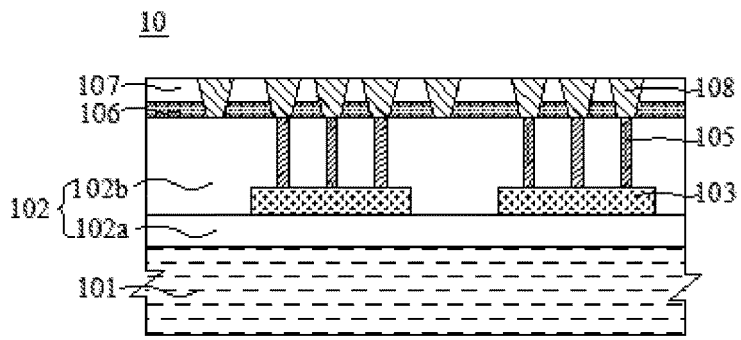

Fig. 1

| |
|---|
| PROVIDE FIRST SUBSTRATE FORMED THEREON WITH FIRST DIELECTRIC LAYER EMBEDDED THEREIN WITH FIRST METAL LAYERS — S1 |
| FORM FIRST SWITCHING HOLES WHICH EXTEND PARTIALLY THROUGH FIRST DIELECTRIC LAYER AND PARTIALLY EXPOSE FIRST METAL LAYERS — S2 |
| FORM FIRST INTERCONNECTION LAYER WHOSE MATERIAL IS FILLED IN FIRST SWITCHING HOLES SO THAT FIRST INTERCONNECTION LAYER IS ELECTRICALLY CONNECTED TO FIRST METAL LAYERS — S3 |
| FORM FIRST INSULATING LAYER WHICH COVERS BOTH SURFACES OF FIRST DIELECTRIC LAYER AND FIRST INTERCONNECTION LAYER — S4 |
| FORM FIRST CONTACT HOLES WHICH PENETRATE THROUGH INSULATING LAYER AND EXPOSE FIRST INTERCONNECTION LAYER — S5 |
| FORM SECOND INTERCONNECTION LAYER WHOSE MATERIAL IS FILLED IN FIRST CONTACT HOLES SO THAT SECOND INTERCONNECTION LAYER IS ELECTRICALLY CONNECTED TO FIRST INTERCONNECTION LAYER — S6 |

Fig. 2

FIRST WAFER, FABRICATING METHOD THEREOF AND WAFER STACK

TECHNICAL FIELD

The present invention relates to integrated circuit (IC) fabrication and, in particular, to a first wafer, a method of fabricating the same and a wafer stack.

BACKGROUND

Wafer bonding is a technique often used to support the ever-growing integration of semiconductor devices and is usually accompanied by wafer interconnection. In practice, a wafer bonding process typically poses stringent requirements on the surface flatness of a wafer to be bonded. Therefore, the surface of the wafer is often planarized by means of chemical mechanical polishing (CMP) prior to the bonding. Vertical interconnect access (via) holes are then etched in the wafer, in which a metal layer to be connected is exposed, followed by the formation of vias by depositing copper in the holes through electroplating.

Currently, this overall procedure is limited by the capabilities of the CMP, etching and copper-electroplating processes. Such limitations lie mainly in that, if the wafer to be bonded has a relatively rough surface, it is necessary to deposit a thick dielectric layer over the surface to compensate for its roughness, which adds a thickness to be reduced by CMP planarization. On the other hand, in order to ensure high thickness uniformity (surface flatness) across the CMP-planarized wafer, it is undesirable for this sacrificial thickness to be significant. As such, the dielectric layer typically has a great thickness even after the polishing, which is equivalent to a great depth of any via hole to be formed by etching the dielectric layer until the metal layer is exposed and to a high aspect ratio at a given critical dimension (CD) of the via hole. This increases the difficulty in filling the hole with copper by electroplating and narrows the process window.

SUMMARY OF THE INVENTION

It is just an objective of the present invention to provide a first wafer, a method of fabricating it and a wafer stack, which can lower the difficulty in fabricating an interconnection structure in a hole with a high aspect ratio and expand the process window.

To this end, the present invention provides a first wafer, including:

a first substrate, a first dielectric layer on the first substrate, first metal layers embedded in the first dielectric layer, first switching holes extending partially through the first dielectric layer and exposing the first metal layers, a first interconnection layer filling up the first switching holes and electrically connected to the first metal layers, a first insulating layer residing on surfaces of both the first dielectric layer and the first interconnection layer, first contact holes extending through the first insulating layer and exposing the first interconnection layer, and a second interconnection layer filling up the first contact holes and electrically connected to the first interconnection layer.

Additionally, the first interconnection layer may be made of a material including tungsten, while the second interconnection layer may be made of a material including copper.

Additionally, the first contact holes may be formed in correspondence with the respective first switching holes, wherein the first contact holes are spaced apart from one another and the first switching holes are also spaced apart from one another.

The present invention also provides a method of fabricating a first wafer. The method includes:

providing a first substrate formed thereon with a first dielectric layer, the first dielectric layer embedded therein with first metal layers;

forming first switching holes which extend partially through the first dielectric layer and partially expose the first metal layers;

forming a first interconnection layer whose material is filled in the first switching holes, the first interconnection layer electrically connected to the first metal layers;

forming a first insulating layer which covers both surfaces of the first dielectric layer and the first interconnection layer;

forming first contact holes which penetrate through the insulating layer and expose the first interconnection layer; and forming a second interconnection layer whose material is filled in the first contact holes, the second interconnection layer electrically connected to the first interconnection layer.

The present invention also provides wafer stack, including:

a first wafer and a second wafer, the first wafer including a first substrate, a first dielectric layer on the first substrate, first metal layers embedded in the first dielectric layer, first switching holes extending partially through the first dielectric layer and exposing the first metal layers, a first interconnection layer filling up the first switching holes and electrically connected to the first metal layers, a first insulating layer residing on surfaces of both the first dielectric layer and the first interconnection layer, first contact holes extending through the first insulating layer and exposing the first interconnection layer, and a second interconnection layer filling up the first contact holes and electrically connected to the first interconnection layer, the second wafer including a second substrate, a second dielectric layer on the second substrate and the second metal layers embedded in the second dielectric layer, the first wafer bonded to the second wafer in such a manner that the first metal layers are electrically connected to the second metal layers.

Additionally, surfaces of the second metal layers may be exposed on the second dielectric layer, wherein the second metal layers of the second wafer are brought into contact with and electrically connected to the second interconnection layer of the first wafer at a bonding interface.

Additionally, the second wafer may further include second switching holes and a third interconnection layer, the second switching holes partially penetrating the second dielectric layer and exposing the second metal layers, the third interconnection layer filling up the second switching holes and being electrically connected to the second metal layers.

Additionally, the third interconnection layer of the second wafer may be brought into contact with and electrically connected to the second interconnection layer of the first wafer at a bonding interface.

Additionally, the second wafer may further include a second insulating layer, second contact holes and a fourth interconnection layer, the second insulating layer residing on surface of the second dielectric layer and the third interconnection layer, the second contact holes penetrating through the second insulating layer and exposing the third interconnection layer, the fourth interconnection layer filling up the second contact holes and being electrically connected to the third interconnection layer, wherein the fourth interconnection layer of the second wafer is brought into contact with and electrically connected to the second interconnection layer of the first wafer at a bonding interface.

Additionally, the wafer stack may further include a third wafer including a third substrate, a third dielectric layer on the third substrate, third metal layers embedded in the third dielectric layer, the third wafer bonded to the second wafer, wherein holes are formed in both the second and third wafers, in which the second and third metal layers are exposed, and wherein a fifth interconnection layer is filled in the holes so as to electrically connect the third metal layers to the second metal layers.

Compared with the prior art, the present invention offers the following advantages:

In the provided first wafer, method and wafer stack, the first switching holes are filled with the first interconnection layer electrically connected to the metal layers, while the first contact holes are filled with the second interconnection layer electrically connected to the first interconnection layer. In this way, the first metal layers can be connected externally by both the second interconnection layer in the first contact holes and the first interconnection layer in the first switching holes. That is, through filling the first contact holes and the first switching holes with different interconnection layers, a section-wise filling approach is entailed. This reduces the difficulty in fabricating interconnection structures for the first metal layers by filling high aspect ratio holes through copper electroplating and results in an expanded process window, thus overcoming the problem of difficulty in filling narrow, deep via holes in wafers to be stacked, bonded and connected together.

BRIEF DESCRIPTION OF DRAWINGS

FIG. 1 is a schematic cross-sectional view of a first wafer according to an embodiment of the present invention.

FIG. 2 shows a schematic flowchart of a method of fabricating a first wafer according to an embodiment of the present invention.

Figure 3:
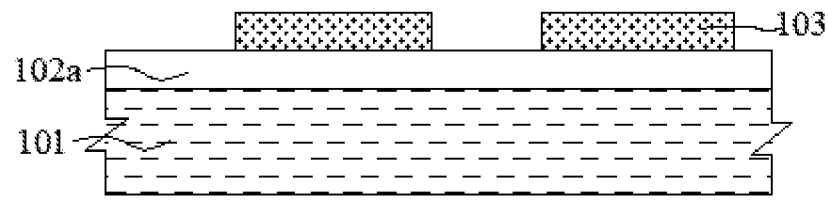
FIGS. 3 to 8 schematically show structures resulting from various steps in the method of fabricating the first wafer according to an embodiment of the present invention.

In these figures:
10—first wafer; 101—first substrate; 102—first dielectric layer; 102a-first portion of the first dielectric layer; 102b-second portion of the first dielectric layer; 103—first metal layer; 104—first switching hole; 105—first interconnection layer; 106—first insulating layer; 107—first passivation layer; 108—second interconnection layer;
20—second wafer; 201—second substrate; 202—second dielectric layer; 203—second metal layer; 205—third interconnection layer; 206—second insulating layer; 207—second passivation layer; 208—fourth interconnection layer;
30—third wafer; 301—third substrate; 302—third dielectric layer; 303—third metal layer; 304—fifth interconnection layer;
A—bonding interface; B—bonding interface.

DETAILED DESCRIPTION OF EXEMPLARY EMBODIMENTS

Specific embodiments of the proposed first wafer, method and wafer stack will be described in greater detail below with reference to the accompanying drawings. From the following detailed description, advantages and features of the invention will become more apparent. Note that the drawings are provided in a very simplified form not necessarily drawn to scale, and their only intention is to facilitate convenience and clarity in explaining the embodiments.

The present invention embodiment provides a first wafer, as shown in FIG. 1.

The first wafer 10 includes a first substrate 101, a first dielectric layer 102 on the first substrate 101, first metal layers 103 embedded in the first dielectric layer 102, first switching holes, a first interconnection layer 105 which is filled in the first switching holes, a first insulating layer 106, first contact holes and a second interconnection layer 108 which is filled in the first contact holes. The first switching holes extend partially through the first dielectric layer 102 in the first wafer 10 and partially expose the first metal layers 103. The first switching holes are filled with the material of the first interconnection layer 105 that is electrically connected to the metal layers 103. The first insulating layer 106 resides on surfaces of the dielectric layer 102 and the first interconnection layer 105. The first contact holes penetrate through the insulating layer 106 and expose the first interconnection layer 105. The first contact holes are filled with the material of the second interconnection layer 108 that is electrically connected to the first interconnection layer 105. In particular, the material of the first interconnection layer 105 may include tungsten, and the material of the second interconnection layer 108 may include copper. The first contact holes are formed in correspondence with the respective first switching holes, and both of these two types of holes are scattered from one another at intervals.

FIG. 2 shows a schematic flowchart of a method of fabricating a first wafer according to an embodiment of the present invention. As shown in FIG. 2, the method includes:

providing a first substrate and forming a first dielectric layer on the first substrate, the first dielectric layer embedded therein with first metal layers;

forming first switching holes which extend partially through the first dielectric layer and partially expose the first metal layers;

forming a first interconnection layer whose material is filled in the first switching holes, the first interconnection layer electrically connected to the first metal layers;

forming a first insulating layer which covers both surfaces of the first dielectric layer and the first interconnection layer;

forming first contact holes which penetrate through the insulating layer and expose the first interconnection layer; and forming a second interconnection layer whose material is filled in the first contact holes, the second interconnection layer electrically connected to the first interconnection layer.

The method of fabricating the first wafer 10 will be described in detail below with reference to FIGS. 3 to 8.

As shown in FIG. 3, a first substrate 101 is provided. A first portion 102a of a first dielectric layer is then formed on the first substrate 101, followed by the formation of a number of first metal layers 103 on the first portion 102a.

Figure 4:
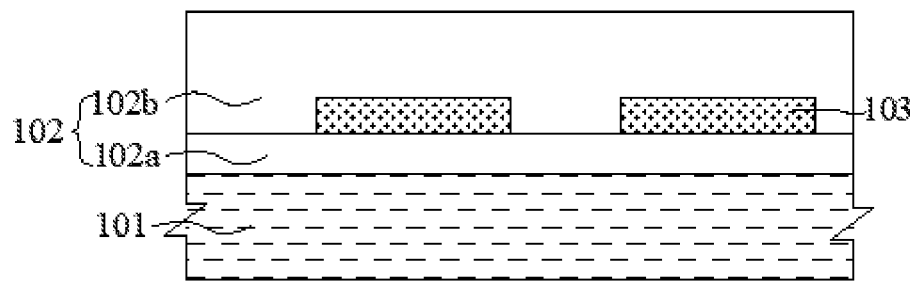

As shown in FIG. 4, a second portion 102b of the first dielectric layer is formed on the first portion 102a thereof so as to cover the first metal layers 103. The first portion 102a and the second portion 102b together constitute the first dielectric layer 102, and a surface of the first dielectric layer 102 has been planarized by chemical mechanical polishing (CMP).

Figure 5:
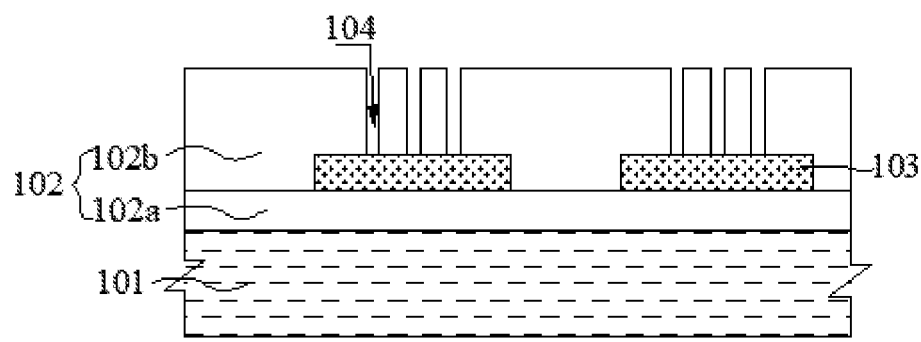

As shown in FIG. 5, the first switching holes 104 are formed, which partially penetrate through the first dielectric layer 102 and expose the first metal layers 103.

Figure 6:
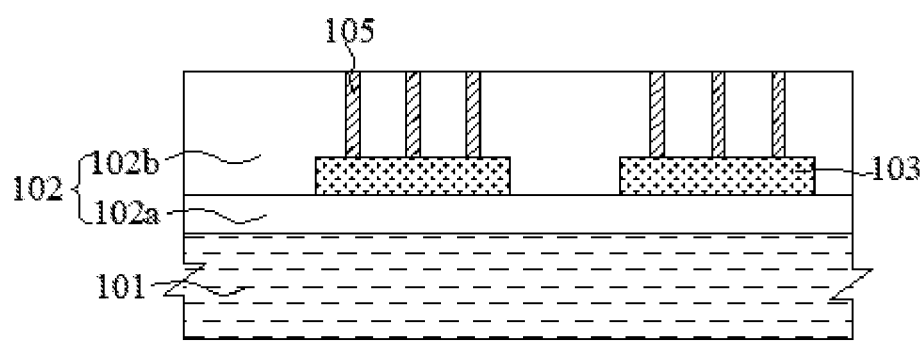

As shown in FIG. 6, the material of a first interconnection layer 105 is deposited and filled in the first switching holes 104 so that the formed first interconnection layer 105 is electrically connected to the first metal layers 103. The material of the first interconnection layer 105 may include tungsten, which is a highly conductive metal that can be easily filled in the holes. The deposition may be accomplished using an evaporation, sputtering or chemical vapor deposition (CVD) process, with a CVD process being preferred because it allows the deposited tungsten to have a low resistivity, high resistance to electromigration and excellent surface flatness even when the holes are small in size. The CVD process also permits selective deposition of tungsten on the metal layers. Tungsten sources that can be used in the CVD process may include tungsten hexachloride ($WCl_6$), tungsten fluoride ($WF_6$) and tungsten hexacarbonyl ($W(CO)_6$). Deposition of tungsten may result from a reaction between $WF_6$ and hydrogen or silane ($SiH_4$). Tungsten filling quality of the CVD process may be optimized by, for example, adjusting the following parameters as follows: 1) increasing the $WF_6/SiH_4$ ratio, partial pressures of $WF_6$ and $SiH_4$ and reaction chamber pressure, during nucleation; 2) increasing the $WF_6/H_2$ ratio and reaction chamber pressure for rapid deposition; 3) raising a preheating pressure; and 4) lowering the reaction temperature. The filling process may be carried out until the first interconnection layer 105 also covers the surface of the first dielectric layer 102, and a CMP or etch-back process may follow to remove the portion of the first interconnection layer above the surface of the first dielectric layer 102. The surface may then be planarized, leaving the remaining portions of the first interconnection layer 105 within the respective first switching holes 104.

Figure 7:
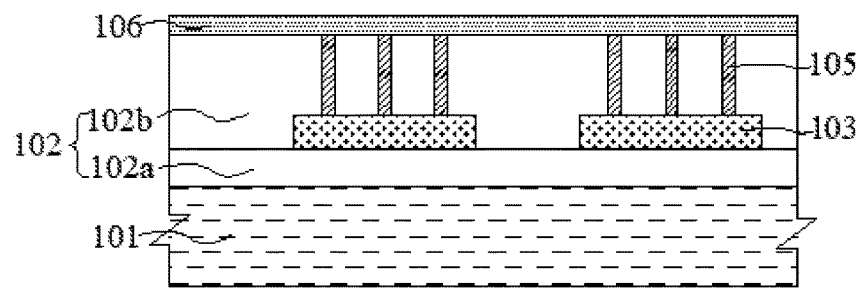
Figure 8:
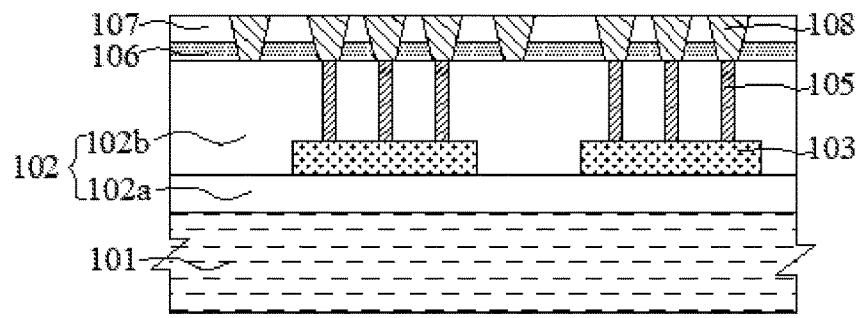
Figure 9:
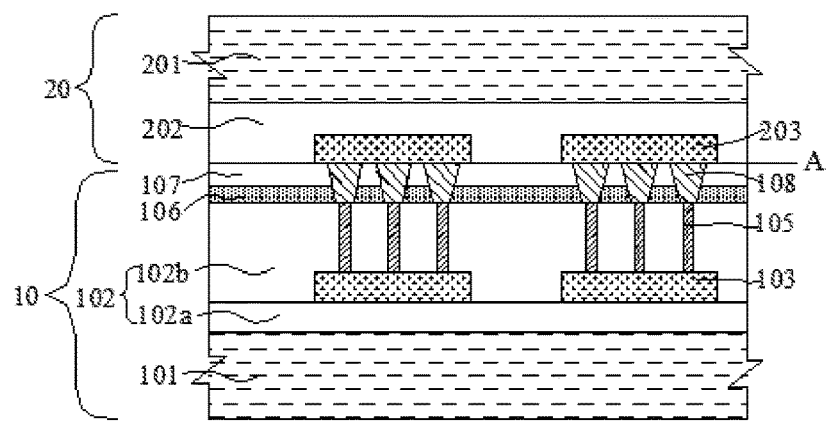
FIG. 9 shows a schematic cross-sectional view of a first wafer stack according to an embodiment of the present invention.

As shown in FIGS. 7 and 8, a first insulating layer 106 is formed, which covers the surfaces of the first dielectric layer 102 and the first interconnection layer 105. The first insulating layer 106 may serve as an etch stop layer for a subsequent process for forming first contact holes (where a second interconnection layer 108 is filled). A passivation layer 107 may be further deposited on the first insulating layer 106. The passivation layer 107 may be, for example, an oxide layer for protecting the surface of the first wafer 10.

As shown in FIG. 8, the first contact holes (where the second interconnection layer 108 is filled) are formed so that the first contact holes penetrate through both the passivation layer 107 and the first insulating layer 106 and expose the first interconnection layer 105. The material of the second interconnection layer 108 is then filled into the first contact holes so that an electrical connection is established between the second interconnection layer 108 and the first interconnection layer 105.

The first contact holes (where the second interconnection layer 108 is filled) are formed in correspondence with the respective first switching holes (where the first interconnection layer 105 is filled). The material of the second interconnection layer 108 may include copper, and the second interconnection layer 108 may be formed by an electroplating process that is followed by CMP planarization of surfaces of the passivation layer 107 and the second interconnection layer 108. In this way, a flat bonding interface can be obtained.

Optionally, the first wafer 10 may further include a first etch stop layer situated between the first metal layers 103 and the second portion 102b of the first dielectric layer.

In embodiments of the present invention, there is also provided a wafer stack including a first wafer and a second wafer.

The first wafer includes a first substrate, a first dielectric layer on the first substrate, first metal layers embedded in the first dielectric layer, the first switching holes extending partially through the first dielectric layer and exposing the first metal layers, a first interconnection layer filling up the first switching holes and electrically connected to the first metal layers, a first insulating layer residing on surfaces of both the first dielectric layer and the first interconnection layer, first contact holes extending through the first insulating layer and exposing the first interconnection layer and a second interconnection layer filling up the first contact holes and electrically connected to the first interconnection layer.

The second wafer includes a second substrate, a second dielectric layer on the second substrate, second metal layers embedded in the second dielectric layer. The first wafer is bonded to the second wafer so that the first metal layers are electrically connected to the second metal layers.

According to such embodiments, the first switching holes are filled with the first interconnection layer electrically connected to the metal layers, while the first contact holes are filled with the second interconnection layer electrically connected to the first interconnection layer. In this way, the first metal layers can be connected externally by both the second interconnection layer in the first contact holes and the first interconnection layer in the first switching holes. That is, through filling the first contact holes and the first switching holes with different interconnection layers, a section-wise filling approach is entailed. This reduces the difficulty in fabricating interconnection structures for the first metal layers by filling high aspect ratio holes through copper electroplating and results in an expanded process window, thus overcoming the problem of difficulty in filling narrow, deep via holes in wafers to be stacked, bonded and connected together.

As shown in a wafer stack according to an embodiment of the present invention includes a first wafer 10 and a second wafer 20. The first wafer 10 includes a first substrate 101, a first dielectric layer 102 on the first substrate 101, first metal layers 103 embedded in the first dielectric layer 102, the first switching holes (where a first interconnection layer 105 is filled), the first interconnection layer 105, a first insulating layer 106, first contact holes (where a second interconnection layer 108 is filled) and the second interconnection layer 108. The first switching holes extend partially through the first dielectric layer 102 in the first wafer 10 and partially expose the first metal layers 103. The first switching holes are filled with the material of the first interconnection layer 105 that is electrically connected to the metal layers 103. The first insulating layer 106 resides on surfaces of the dielectric layer 102 and the first interconnection layer 105. The first contact holes penetrate through the insulating layer 106 and expose the first interconnection layer 105. The first contact holes are filled with the material of the second interconnection layer 108 that is electrically connected to the first interconnection layer 105. In particular, the material of the first interconnection layer 105 may include tungsten, and the material of the second interconnection layer 108 may include copper. The first contact holes are formed in correspondence with the respective first switching holes.

The second wafer 20 includes a second substrate 201, a second dielectric layer 202 on the second substrate 201 and the second metal layers 203 embedded in the second dielectric layer 202. The first wafer 10 is so bonded to the second wafer 20 that the first metal layers 103 are electrically connected to the second metal layers 203. Specifically, surfaces of the second metal layers 203 may be exposed on the second dielectric layer 202, and the second metal layers 203 of the second wafer 20 may be brought into contact with and electrically connected to the second interconnection layer 108 of the first wafer 10 at a bonding interface A.

This embodiment is suitable for scenarios where the first wafer 10 to be bonded has narrow, deep (i.e., a high aspect ratio) via holes (extending from the bonding interface A to top surfaces of the first metal layers 103) and the second metal layers 203 of the second wafer 20 are exposed (e.g., in a semi-finished state). Each of the via holes in the first wafer 10 has a depth defined as the distance from the bonding interface A to the top surface of a corresponding one of the first metal layers 103.

Figure 10:
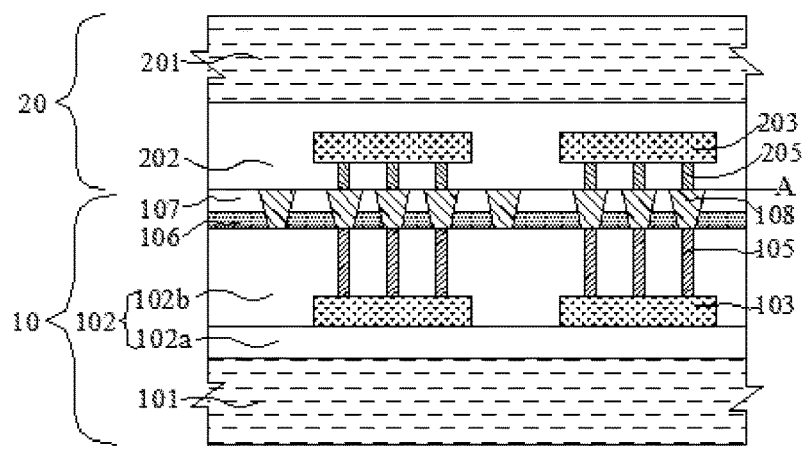
FIG. 10 shows a schematic cross-sectional view of a second wafer stack according to an embodiment of the present invention.

As shown in FIG. 10, the second wafer 20 may further include second switching holes (where a third interconnection layer 205 is filled) and the third interconnection layer 205. The second switching holes may partially penetrate the second dielectric layer 202 and expose the second metal layers 203, the material of the third interconnection layer 205 may be filled in the second switching holes so that the third interconnection layer 205 is electrically connected to the second metal layers 203. The third interconnection layer 205 of the second wafer 20 may be brought into contact with and electrically connected to the second interconnection layer 108 of the first wafer 10 at a bonding interface A.

This embodiment is suitable for scenarios where the first wafer 10 to be bonded has narrow, deep (i.e., a high aspect ratio) via holes (extending from the bonding interface A to the first metal layers 103) and the second wafer 20 has shallow via holes (extending from the bonding interface A to the second metal layers 203). Specifically, each of the via holes in the first wafer 10 has a depth defined as the distance from the bonding interface A to the first metal layers 103, while the each of the via holes in the second wafer 20 has a depth defined as the distance from the bonding interface A to the second metal layers 203.

Figure 11:
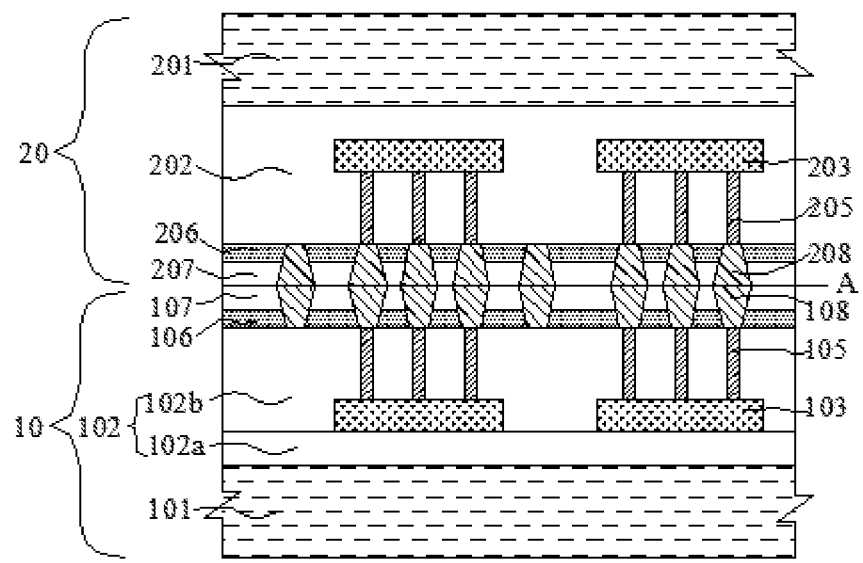
FIG. 11 shows a schematic cross-sectional view of a third wafer stack according to an embodiment of the present invention.

As shown in FIG. 11, the second wafer 20 may further include a second insulating layer 206, second contact holes (where a fourth interconnection layer 208 is filled) and the fourth interconnection layer 208, the second insulating layer 206 residing on surfaces of the second dielectric layer 202 and third interconnection layer 205, the second contact hole (where a fourth interconnection layer 208 is filled) penetrating through the second insulating layer 206 and exposing the third interconnection layer 205, the fourth interconnection layer 208 filling up the second contact holes and being electrically connected to the third interconnection layer 205. The fourth interconnection layer 208 of the second wafer 20 may be brought into contact and electrically connected to the second interconnection layer 108 of the first wafer 10 at a bonding interface A. In this embodiment, the second wafer 20 may be similar to or the same as the first wafer 10 in structure.

This embodiment is suitable for scenarios where both the wafers to be bonded and electrically connected together have narrow, deep (i.e., a high aspect ratio) via holes (extending from the bonding interface A to the respective metal layers). Specifically, each of the via holes in the first wafer has a depth defined as the distance from the bonding interface A to the first metal layers 103, while the each of the via holes in the second wafer 20 has a depth defined as the distance from the bonding interface A to the second metal layers 203.

In order for a reduced overall thickness of the wafer stack to be obtained, the first wafer 10 and/or second wafer 20 may be thinned after they are bonded together.

Optionally, as shown in FIG. 11, the first contact holes (where the second interconnection layer 108 is filled) are provided in correspondence with the respective first switching holes (where the first interconnection layer 105 is filled). The first switching holes may be spaced apart from one another, and the first contact holes may also be spaced apart from one another. In other words, both the first switching holes and the first contact holes may be hold arrays. Similarly, both the second switching holes (where the third interconnection layer 205 is filled) and the second contact holes (where the fourth interconnection layer 208 is filled) may also be hold arrays. Scattering both the second interconnection layer 108 and the fourth interconnection layer 208 in contact therewith among the holes that are spaced apart from one another can result in both increased interconnection reliability and better heat dissipation of the interconnection layers. Moreover, the spaced-apart holes may be reduced in size and arranged more densely in order to address particular applications requiring, for example, extraction of dense low-current signals.

Figure 12:
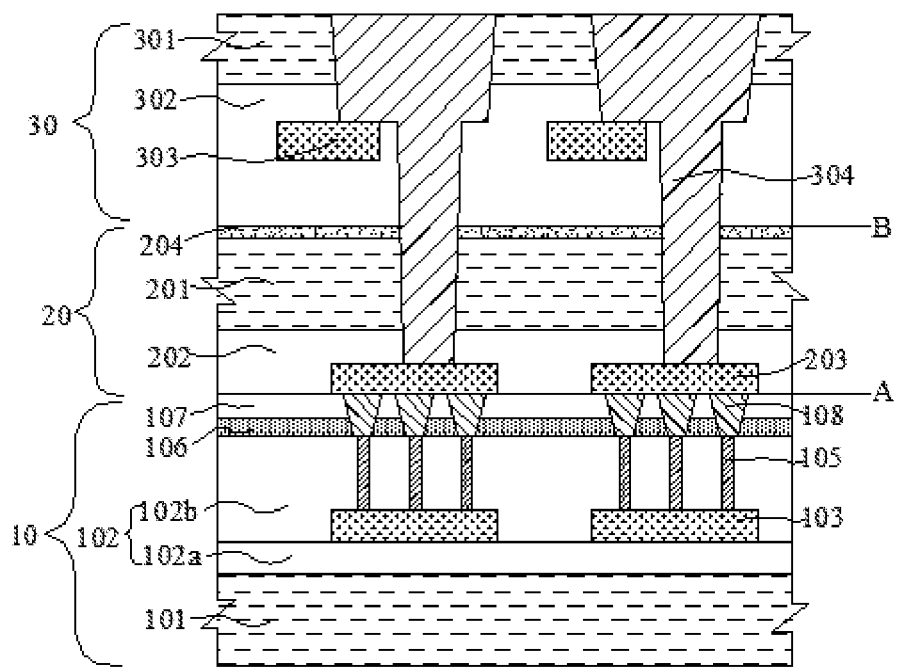
FIG. 12 shows a schematic cross-sectional view of a fourth wafer stack according to an embodiment of the present invention.

As shown in FIG. 12, in an embodiment of the present invention, there is also provided a wafer stack including three wafers: a first wafer 10, a second wafer 20 and a third wafer 30. The first wafer 10 is the same as described above and will not be further detailed to avoid redundancy. The second wafer 20 includes a second substrate 201, a second dielectric layer 202 on the second substrate 201 and the second metal layers 203 embedded in the second dielectric layer 202. Surfaces of the second metal layers 203 are exposed on the second dielectric layer 202, and the second metal layers 203 of the second wafer 20 are brought into contact with and electrically connected to the second interconnection layer 108 of the first wafer 10 at a bonding interface A.

The third wafer 30 includes a third substrate 301, a third dielectric layer 302 on the third substrate 301 and third metal layers 303 embedded in the third dielectric layer 302. The second wafer 20 is bonded to the third wafer 30 at a bonding interface B. Holes are formed in the second and third wafers 20, 30, in which the second and third metal layers 203, 303 are exposed. A fifth interconnection layer 304 is filled in the holes so as to connect the third metal layers 303 to the second metal layers 203. Since the second interconnection layer 108 is brought into contact with and electrically connected to the second metal layers 203, a shortened wafer-to-wafer interconnection length can be obtained, which results in reduced parasitic capacitance, lower power loss and an enhanced transmission speed. Bonding at the first bonding interface A is accomplished both in metal-to-metal (the second interconnection layer 108 to the second metal layers 203) and dielectric-to-dielectric (the second dielectric layer 202 to the passivation layer 107) manners (since the passivation layer 107 is usually formed of the same material as the dielectric layers, it can also be considered as a dielectric layer) and can be strengthened by a subsequent thermal treatment capable of enhancing the diffusion of metal ions. In this way, the first and second wafers 10, 20 can be bonded together with higher strength, and interconnection between the three wafers can be attained.

In order for a reduced overall thickness of the wafer stack to be obtained, the first wafer 10 and/or second wafer 20 may be thinned after they are bonded together, and the third wafer 30 may be thinned after the second wafer 20 is bonded thereto.

In practice, any wafer stack consisting of multiple wafers can be constructed in accordance with the present invention as actually required, including the first wafer 10, the second wafer 20 in any of many possible structural variations, and optionally the third wafer 30 also in any of many possible structural variations. In this structure, any adjacent two of the wafers are bonded and connected together with an increased density, thus making the final devices fabricated from this structure more powerful.

The present invention is not limited to whether the first or second wafer is located above/under the other one because their positions are interchangeable. While only one of the possible positional relationships between the two wafers is described herein in order to simplify and facilitate the description, it will be readily appreciated by those skilled in the art that all the features disclosed herein are equally applicable to the other possible positional relationship in which the first and second wafers are vertically inverted. In this case, all the semiconductor components contained in the stacked wafers are also vertically inverted. Sometimes, between two wafers to be bonded together, it is preferred to place the one that bows more under the other. However, in such cases, it is still possible to determine whether to flip the boned wafers upside down or not as actually required by the designed final vertical orientation of the wafers.

It is to be noted that, as used herein, the ordinal terms "first", "second", "third", "fourth", etc. are only intended to distinguish between different components or processes having the same nomenclatures rather than indicating any ordinal or positional relationship. In addition, different components having the same nomenclature, such as the "first substrate" and the "second substrate", or the "first dielectric layer" and the "second dielectric layer", etc., do not necessarily have the same structure or composition. For example, although not shown, in most cases, the "first substrate" may include different components from those in the "second substrate", and they may have different structures. In some embodiments, a substrate may be a semiconductor substrate fabricated from any semiconductor material (e.g., Si, SiC, SiGe, etc.) that is suited to accommodate semiconductor devices or components. In other embodiments, a substrate may alternatively be a composite substrate such as a silicon-on-insulator (SOI) or silicon-germanium-on-insulator (SGOI) substrate. It will be readily appreciated by those skilled in the art that such a substrate is not limited to any particular type and can be selected as actually required. Although not shown, a substrate may be provided therein components of various devices (not limited to semiconductor ones) including those not described herein, such as gate structures, contact holes, dielectric layers, metal traces, vias and the like.

In summary, in the provided first wafer, method and wafer stack, the first switching holes are filled with the first interconnection layer electrically connected to the first metal layers, while the first contact holes are filled with the second interconnection layer electrically connected to the first interconnection layer. In this way, the first metal layers in the first wafer can be connected externally by both the second interconnection layer in the first contact holes and the first interconnection layer in the first switching holes. That is, through filling the first contact holes and the first switching holes with different interconnection layers, the difficulty in fabricating interconnection structures for the first metal layers by filling high aspect ratio holes through copper electroplating is reduced and an expanded process window is obtained, thus overcoming the problem of difficulty in filling narrow, deep via holes in wafers to be stacked, bonded and connected together. This can also result in a reduced overall thickness of the resulting wafer stack, which allows a higher package density, i.e., a greater number of wafers per unit package volume and is thus compatible with the ever-growing demand for thinner and lighter semiconductors. This invention enables higher integration of wafers with various functions within a single package, making them extremely advantageous in terms of performance, functionality and size.

The description presented above is merely that of a few preferred embodiments of the present invention and does not limit the scope thereof in any sense. Any and all changes and modifications made by those of ordinary skill in the art based on the above teachings fall within the scope as defined in the appended claims.

What is claimed is:

1. A wafer stack, comprising:
a first wafer and a second wafer, the first wafer comprising a first substrate, a first dielectric layer on the first substrate, first metal layers embedded in the first dielectric layer, first switching holes completely formed in the first dielectric layer and exposing the first metal layers, a first interconnection layer filling up the first switching holes and electrically connected to the first metal layers, a first insulating layer residing on surfaces of both the first dielectric layer and the first interconnection layer, first contact holes extending through the first insulating layer and exposing the first interconnection layer, and a second interconnection layer filling up the first contact holes and electrically connected to the first interconnection layer,
the second wafer comprising a second substrate, a second dielectric layer on the second substrate and second metal layers embedded in the second dielectric layer, the first wafer bonded to the second wafer in such a manner that the first metal layers are electrically connected to the second metal layers;
wherein surfaces of the second metal layers are exposed on the second dielectric layer, and wherein the second metal layers of the second wafer are brought into contact with and electrically connected to the second interconnection layer of the first wafer at a bonding interface.

2. A wafer stack, comprising:
a first wafer and a second wafer, the first wafer comprising a first substrate, a first dielectric layer on the first substrate, first metal layers embedded in the first dielectric layer, first switching holes completely formed in the first dielectric layer and exposing the first metal layers, a first interconnection layer filling up the first switching holes and electrically connected to the first metal layers, a first insulating layer residing on surfaces of both the first dielectric layer and the first interconnection layer, first contact holes extending through the first insulating layer and exposing the first interconnection layer, and a second interconnection layer filling up the first contact holes and electrically connected to the first interconnection layer, the second wafer comprising a second substrate, a second dielectric layer on the second substrate and second metal layers embedded in the second dielectric layer, the first wafer bonded to the second wafer in such a manner that the first metal layers are electrically connected to the second metal layers, wherein the second wafer further comprises second switching holes and a third interconnection layer, the second switching holes partially penetrating the second dielectric layer and exposing the second metal layers, the third interconnection layer filling up the second switching holes and being electrically connected to the second metal layers, wherein the third interconnection layer of the second wafer is brought into contact with and electrically connected to the second interconnection layer of the first wafer at a bonding interface.

3. A wafer stack, comprising:

a first wafer and a second wafer, the first wafer comprising a first substrate, a first dielectric layer on the first substrate, first metal layers embedded in the first dielectric layer, first switching holes completely formed in the first dielectric layer and exposing the first metal layers, a first interconnection layer filling up the first switching holes and electrically connected to the first metal layers, a first insulating layer residing on surfaces of both the first dielectric layer and the first interconnection layer, first contact holes extending through the first insulating layer and exposing the first interconnection layer, and a second interconnection layer filling up the first contact holes and electrically connected to the first interconnection layer, the second wafer comprising a second substrate, a second dielectric layer on the second substrate and second metal layers embedded in the second dielectric layer, the first wafer bonded to the second wafer in such a manner that the first metal layers are electrically connected to the second metal layers, wherein the second wafer further comprises second switching holes and a third interconnection layer, the second switching holes partially penetrating the second dielectric layer and exposing the second metal layers, the third interconnection layer filling up the second switching holes and being electrically connected to the second metal layers, wherein the second wafer further comprises a second insulating layer, second contact holes and a fourth interconnection layer, the second insulating layer residing on surface of the second dielectric layer and the third interconnection layer, the second contact holes penetrating through the second insulating layer and exposing the third interconnection layer, the fourth interconnection layer filling up the second contact holes and being electrically connected to the third interconnection layer, and wherein the fourth interconnection layer of the second wafer is brought into contact with and electrically connected to the second interconnection layer of the first wafer at a bonding interface.

4. The wafer stack of claim 1, further comprising a third wafer comprising a third substrate, a third dielectric layer on the third substrate, third metal layers embedded in the third dielectric layer, the third wafer bonded to the second wafer.

5. The wafer stack of claim 4, wherein holes are formed in both the second and third wafers, in which the second and third metal layers are exposed, and wherein a fifth interconnection layer is filled in the holes so as to electrically connect the third metal layers to the second metal layers.

6. The wafer stack of claim 1, wherein the first interconnection layer is made of a material comprising tungsten, and wherein the second interconnection layer is made of a material comprising copper.

7. The wafer stack of claim 1, further comprising a passivation layer deposited on the first insulating layer, wherein the passivation layer is an oxide layer.

* * * * *